United States Patent
Wen

Patent Number: 6,001,691
Date of Patent: Dec. 14, 1999

[54] METHOD OF MANUFACTURING A TRIPLE LEVEL ROM

[75] Inventor: Jemmy Wen, Hsinchu, Taiwan

[73] Assignee: United Microelectronics Corp., Taiwan

[21] Appl. No.: 08/964,611

[22] Filed: Nov. 5, 1997

Related U.S. Application Data

[62] Division of application No. 08/807,461, Feb. 27, 1997, abandoned.

[30] Foreign Application Priority Data

Nov. 25, 1996 [TW] Taiwan .................................. 85114543

[51] Int. Cl.⁶ ................................................ H01L 21/8246
[52] U.S. Cl. ............................ 438/275; 438/276; 438/289
[58] Field of Search ..................................... 438/275–278, 438/289

[56] References Cited

U.S. PATENT DOCUMENTS

| | | | |
|---|---|---|---|
| 5,576,573 | 11/1996 | Su et al. .................................... | 257/391 |
| 5,811,337 | 9/1998 | Wen ........................................ | 438/275 |

*Primary Examiner*—Jey Tsai
*Attorney, Agent, or Firm*—Rabin & Champagne, PC

[57] ABSTRACT

A method of making a triple level ROM device includes forming at least first, second and third metallic oxide semiconductor (MOS) structures. Each MOS structure has a source terminal and a drain terminal located within a substrate, a channel located between the source and drain terminals, and a gate terminal structure located above the channel. The source and drain terminals serve as bit lines and the gate terminal serves as a word line. A dielectric layer and a cap layer are formed in sequence above the first, second and third MOS structures, thereby forming first, second and third memory cell units from the first, second and third MOS structures, respectively. A first coding process is performed, which includes forming a photoresist layer above the gate terminal structure of at least the first memory cell unit. Portions of the cap layer having no photoresist coverage are removed to form a cap above the first memory cell unit. A second coding process is performed, which includes selectively implanting ions into the channel regions of the first and second memory cell units, whereby threshold voltages of the first and second memory cell units, respectively, are adjusted. The invention is also directed to a triple level ROM structure including a plurality of metallic oxide semiconductor memory cell units, which include source/drain regions, channel regions having impurity concentrations different from each other, gate terminal structures, and caps located over the gate terminal structures.

10 Claims, 6 Drawing Sheets

METHOD OF MANUFACTURING A TRIPLE LEVEL ROM

This is a Division of Application Ser. No. 08/807,461, filed Feb. 27, 1997 abandoned.

BACKGROUND OF THE INVENTION

1. Field of Invention

This invention relates, in general, to a method of manufacturing a triple level read only memory (ROM) device, and to a ROM device manufactured using the method.

2. Description of Related Art

ROM devices are widely used in digital equipment, such as micro-computers and microprocessor systems, for storing vital system information. The known methods of manufacturing ROM devices are complicated, time consuming and expensive to implement. Hence, customers typically submit a program code to the ROM factory and let the factory code the program into their ROM products.

Most ROM components, aside from differences in the code stored during the programming stage, have basically the same physical structure. Therefore, the ROM device can be manufactured up to a stage just prior to the performing of the actual programming, and stored as a partially finished product in a warehouse. When the customer places an order for a ROM requiring a certain program code, a photomask can be immediately manufactured, so that programming can be performed on short notice. Photomask programming of pre-manufactured ROM devices is widely used in the industry.

Typically, a channel transistor is used as the basic memory cell unit of the ROM device. During the programming stage, ions are selectively implanted into specified channels, thus adjusting the threshold voltage and achieving an ON/OFF control state of the memory unit, as stipulated by the coding process.

FIG. 1 is a top view of ROM memory cell units 100, 101, 102 and 103 in an integrated circuit. In FIG. 1, polysilicon bit lines (BL) extend across word lines (WL). A channel 10 is formed, for example, in the memory cell unit 100, in an area beneath the bit line and where the bit line crosses the word line. A bit "0" or "1" is stored in the binary level memory cell unit 100, depending on whether or not ions have been implanted into the channel 10.

Products having a binary level configuration, as described above, have a restricted memory capacity. As such, coding techniques using three or more levels have been suggested. At present, a multiple coding implantation method is used in the fabrication of multiple level ROM units to generate different threshold voltages on different memory cell units.

FIG. 2 is a graph showing the relationship between different threshold voltages $V_T$, $V_{T1}$ and $V_{T2}$ versus the drain current, of a known ROM device having multiple level logic states. The threshold voltages are generated by the selective implantation of ions into the channels of the memory cell units. However, this known method requires that the number of coding implants be increased to produce the multiple level ROM device. As such, production time is increased, thus decreasing the competitiveness of a product made using this method.

SUMMARY OF THE INVENTION

It is therefore an object of the present invention to provide a method of making a triple level ROM device, in which different mask structures are placed on top of the memory cell channels to produce memory cells having different threshold voltages through a single coding implantation.

To achieve the above object, a triple level ROM structure is provided. The triple level ROM structure includes a plurality of metallic oxide semiconductor memory cell units, and includes a plurality of source/drain regions serving as bit lines. A plurality of channel regions are provided, each being located between a respective source region and drain region, and each having an impurity concentration that is different from other channel regions. A plurality of gate terminal structures are provided that serve as word lines. Each gate terminal structure is located above a respective channel region. A plurality of caps are provided, each being located over a selected one gate terminal structure.

The invention is also directed to a method of making a triple level ROM device. which includes forming at least first, second and third metallic oxide semiconductor (MOS) structures. Each MOS Structure has a source and a drain terminal located within a substrate, a channel located between the source and the drain terminal, and a gate terminal structure located above the channel. The source and drain terminals serve as bit lines and the gate terminal serves as a word line. A dielectric layer and a cap layer are formed in sequence above the first, second and third MOS structures, thereby forming first, second and third memory cell units from the first, second and third MOS structures, respectively. A first coding process is performed, which includes forming a photoresist layer above the gate terminal structure of at least the first memory cell unit. Portions of the cap layer having no photoresist coverage are removed to form a cap above the first memory cell unit. A second coding process is performed, which includes selectively implanting ions into the channel regions of the first and second memory cell units, whereby a threshold voltage of the first and second memory cell units, respectively, are adjusted.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1:
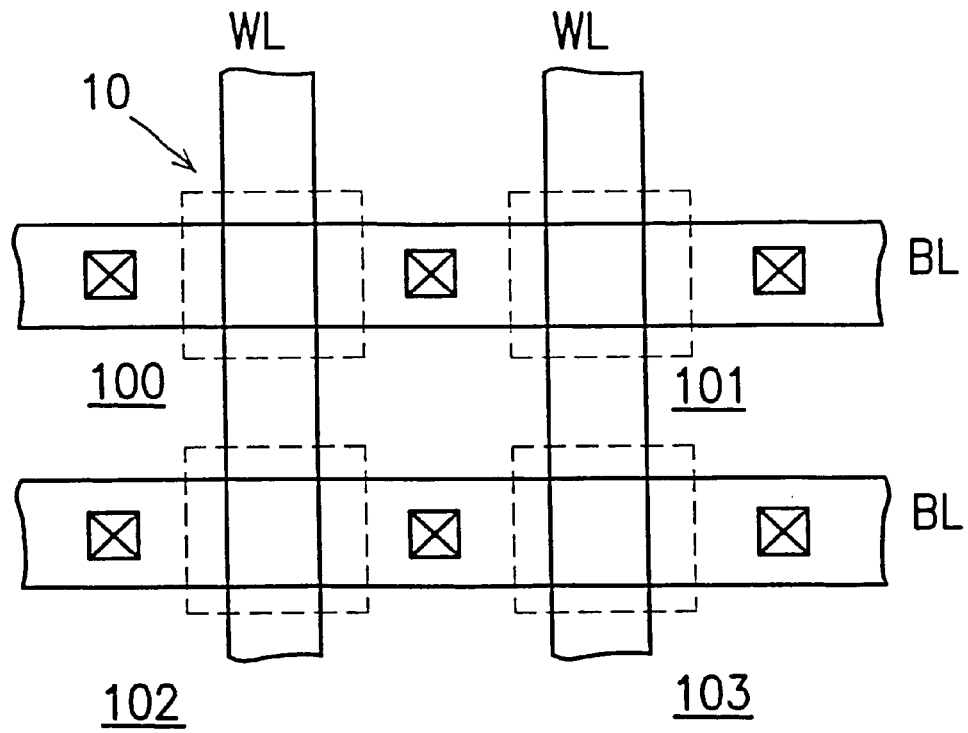
FIG. 1 is a top view of the memory cell units of a known ROM device in an integrated circuit.
Figure 2:
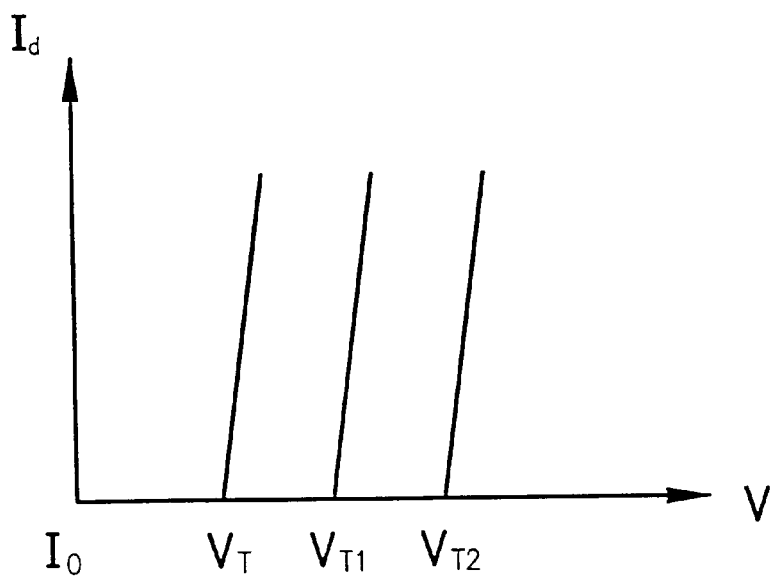
FIG. 2 is a graph showing the relationship between different threshold voltages $V_T$, $V_{T1}$ and $V_{T2}$ versus the drain current, of a known ROM device having multiple level logic states, in which the threshold voltages are generated by the selective implantation of ions into the channels of the memory cell units.
Figure 3A:
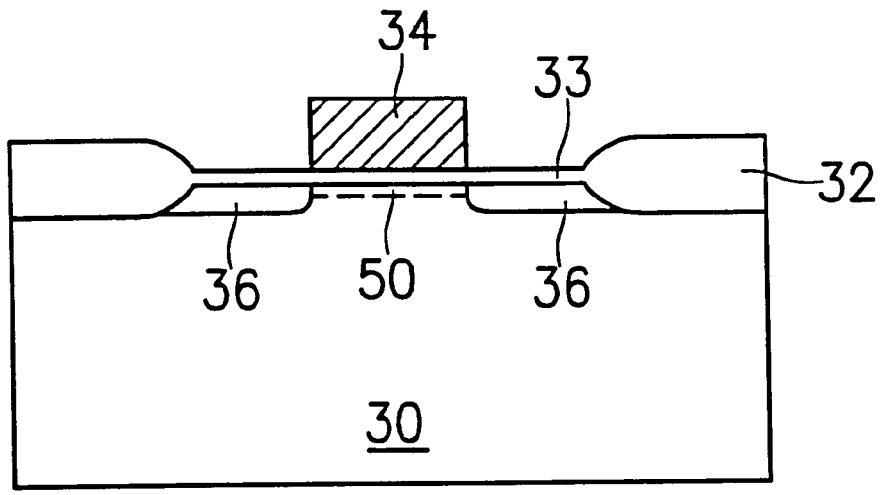
FIGS. 3A and 3B are cross-sectional views of a memory cell unit during manufacture according to a preferred embodiment of this invention.

Referring to FIG. 3A, a field oxide layer 32 is formed on a semiconductor substrate 30, for example a P-type or an N-type silicon substrate, to define active regions. A gate oxide layer 33 and a gate terminal structure 34 are formed over the semiconductor substrate 30. This is followed by the implanting of ions, which forms source and drain regions 36 which have a polarity opposite to that of the substrate. For example, N-type ions can be implanted into a P-type silicon substrate, or P-type ions can be implanted into an N-type silicon substrate. Thus, a MOS transistor component is formed.

Next, a channel region 50 is formed on the semiconductor substrate 30 between adjacent source and drain regions 36, and underneath the gate terminal structure 34. The threshold voltage is adjusted to a set level, for example, $V_{ta}$, using an ion implantation process. The adjustment of the threshold voltage is not restricted to the process described herein. Any other process, as long as the necessary processing parameters are met, can be used instead.

Figure 3B:
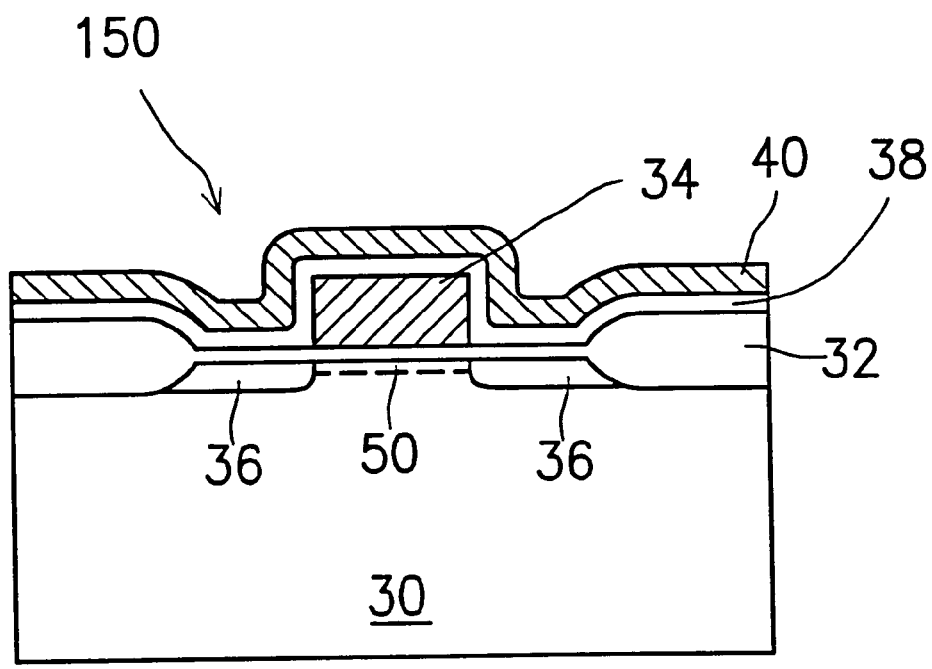

Referring next to FIG. 3B, in a subsequent step a dielectric layer 38 is formed over the MOS transistor, for example, by depositing a silicon dioxide layer. Then, a cap layer 40 is formed, for example, by depositing a polysilicon layer, a metallic layer, an oxide layer or a nitride layer, resulting in a basic ROM unit 150.

Figure 4A:
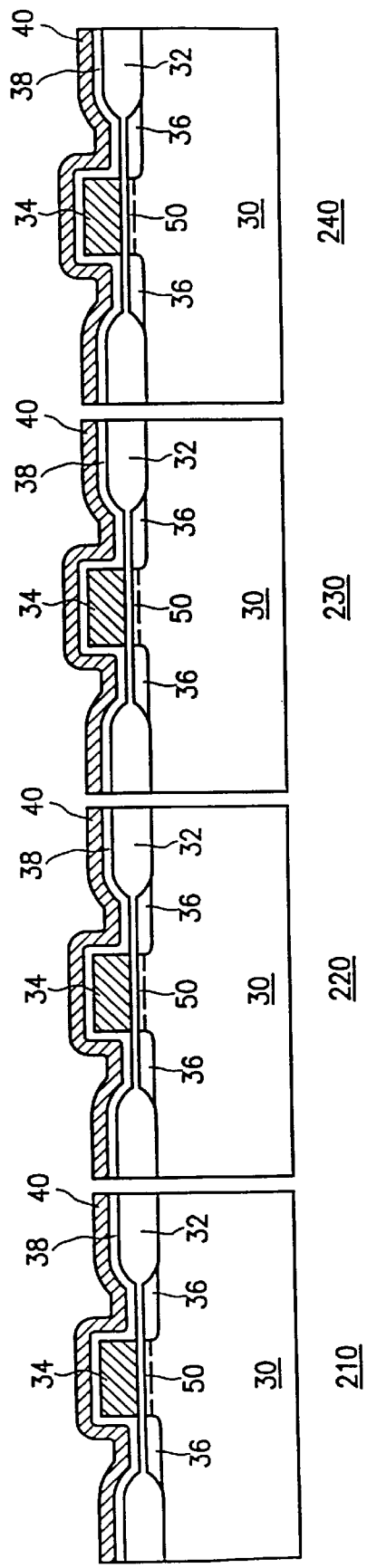
FIGS. 4A through 4D are cross-sectional views of a ROM device during manufacture according to a preferred embodiment of this invention.

Referring next to FIG. 4A, a plurality of MOS ROM units, each being similar to the ROM unit 150 shown in FIG. 3B, are provided. Each ROM unit has a gate terminal structure 34 (which serves as a word line), source and drain regions 36 (which serve as bit lines), a channel region 50, and a cap layer 40. In the Figure, four types of unit cells are provided, i.e., a type-one memory cell unit 210, a type-two memory cell unit 220, a type-three memory cell unit 230 and a type-four memory cell unit 240. However, depending on design criteria, the present invention may have fewer than four unit cells, or more than four unit cells. Further, the actual arrangement of the memory cell units does not necessarily need to be in the order shown in the Figure.

Figure 4B:
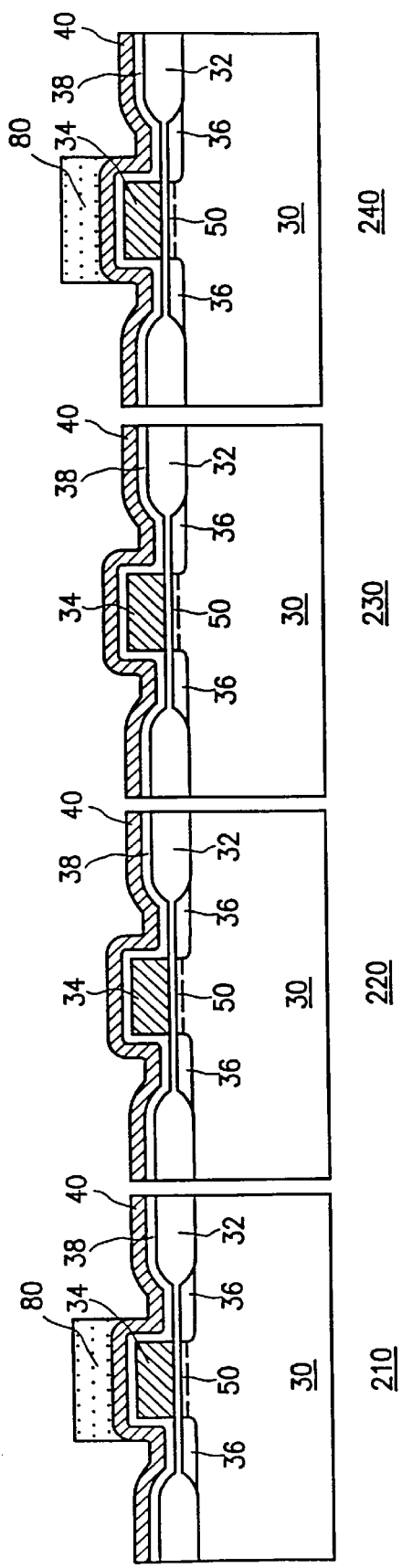
Figure 4C:
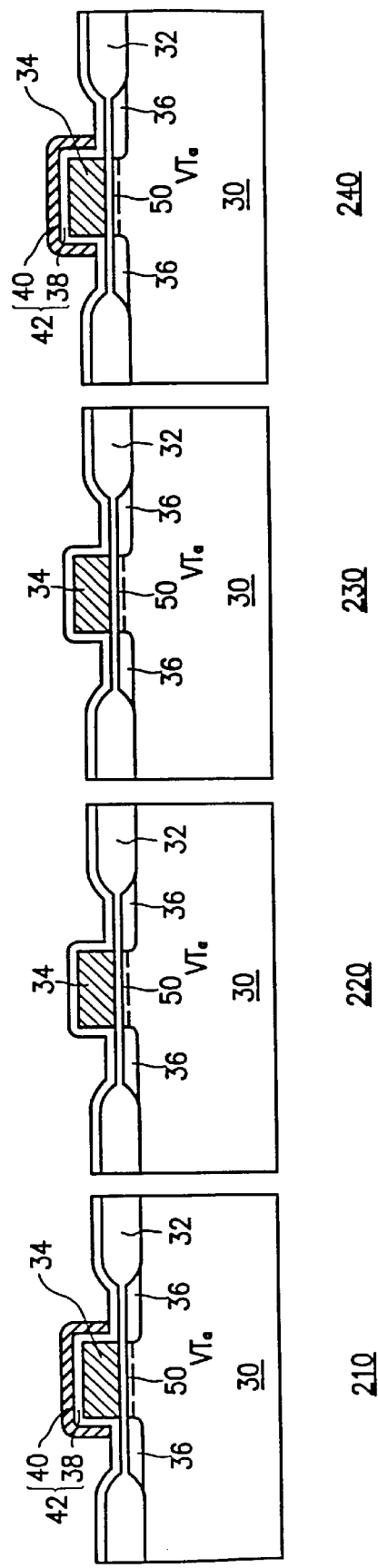

Referring next to FIGS. 4B and 4C, a first coding process is performed. The first coding process includes forming, using photolithographic techniques, a photoresist layer 80 over at least the type-one memory cell unit 210. However, and as shown, the photoresist layer may also be formed over the type-four memory cell unit 240. Next, the portions of the cap layer 40 not protected by the photoresist layer 80 are etched away, thus forming a cap 42 over at least the type-one 210 (and as shown, the type-four 240) memory cell unit. Thus, the entire cap layer 40 covering the type-two 220 and the type-three 230 memory cell units is removed.

Figure 4D:
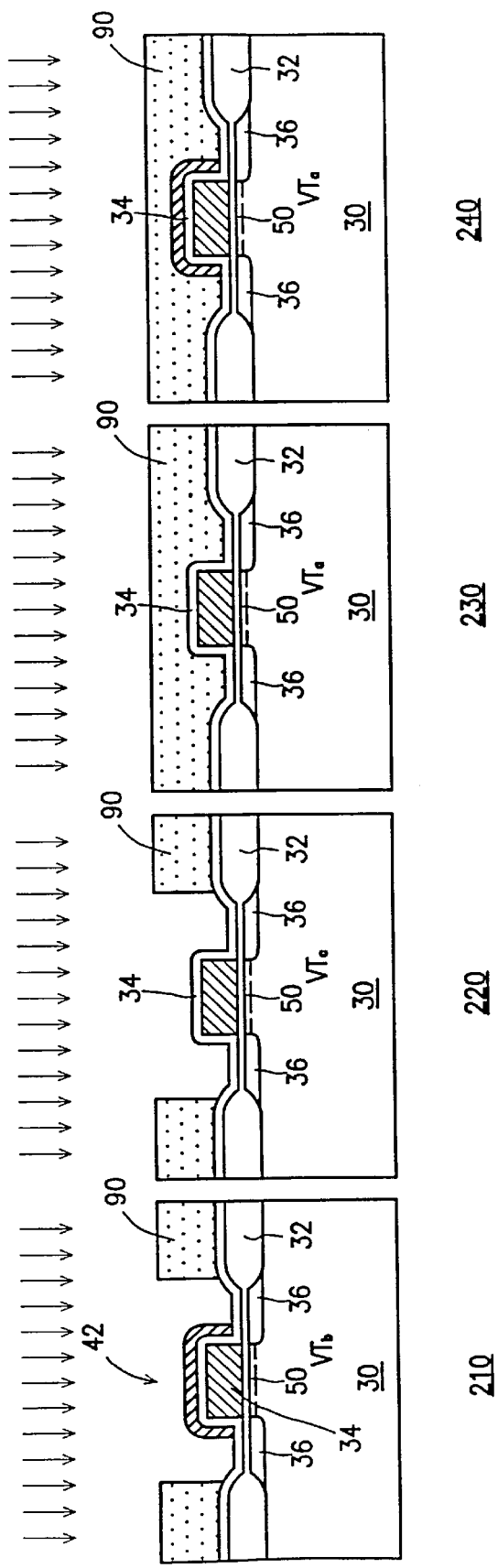

Referring to FIG. 4D, a second coding process is performed. The second coding process includes forming, using photolithographic techniques, a photoresist layer 90 over the memory cell units. Next, the regions above the gate terminal structures 34 in the type-one 210 and type-two 220 memory cell units are exposed. In the process, the surface of cap 42 of the type-one 210 memory cell unit is exposed. Afterwards, an ion implantation operation is performed to implant ions into the respective channel regions 50 of the type-one 210 and type-two 220 memory cell units. This changes the threshold voltage of the type-one memory cell unit 210 from $V_{Ta}$ to $V_{Tb}$, and changes the threshold voltage of the type-two memory cell unit 220 from $V_{Ta}$ to $V_{Tc}$. However, the threshold voltages for the type-three 230 and type-four 240 memory cell units are maintained at their original value $V_{Ta}$ due to the protective covering of photoresist layer 90. As a result, the type-one memory cell unit 210, the type-two memory cell unit 220, the type-three memory cell unit 230 and the type-four memory cell unit 240 each has its own threshold voltage level (with the threshold voltages for the type-three 230 and type-four 240 memory cell units being the same); as such, a triple level ROM device is produced. The value of the respective threshold voltages $V_{Ta}$, $V_{Tb}$ and $V_{Tc}$ depends on the type of MOS component selected (i.e., whether PMOS or NMOS) and the types of ions (i.e., whether P-type or N-type ions) used in the coding process. However, in general, because of the presence of the cap 42 over the gate terminal structure 34 in the type-one memory cell unit 210, the type-one memory cell unit 210 will have a lower implanted ion concentration than the type-two memory cell unit 220.

The foregoing discussion of this embodiment outlines the method of forming a triple level ROM device. A cap layer 40 is formed above the MOS transistor, and a first coding process is performed to selectively remove portions of the cap layer. Thereafter, all that is needed to establish the various levels in the ROM device is a second coding process using the implantation of a single ion type.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a triple level ROM device, comprising:
    (a) forming at least first, second and third metallic oxide semiconductor (MOS) structures, each having a source region and a drain region located within a substrate, a channel located between the source and the drain regions, and a gate terminal structure located above the channel, the source and drain regions serving as bit lines and the gate structures serving as a word line;
    (b) forming a dielectric layer and a cap layer in sequence above the first, second and third MOS structures, thereby forming first, second and third memory cell units from the first, second and third MOS structures, respectively;
    (c) performing a first coding process, including:
        forming a photoresist layer above the gate terminal structure of the first memory cell unit and covering at least a portion of the cap layer; and
        removing portions of the cap layer having no photoresist coverage, to form a cap above the first memory cell unit; and
    (d) performing a second coding process, including: selectively implanting ions into the channel regions of the first and second memory cell units, whereby threshold voltages of the first and second memory cell units, respectively, are adjusted.

2. The method according to claim 1, wherein the substrate comprises a silicon substrate.

3. The method according to claim 1, wherein the performing a second coding process further includes:
    covering the first, second and third memory cell units with a further photoresist layer; and
    removing the further photoresist layer above the channels of the first and second memory cell units; and wherein the selectively implanting ions includes adjusting an impurity concentration in the channels of the first and second memory cell units by ion implantation.

4. The method according to claim 3, wherein the removing the further photoresist layer includes using light exposure and development techniques.

5. The method according to claim 1, wherein the removing portions of the cap layer includes removing the portions by etching the cap layer.

6. A method of making a triple level ROM device, comprising:

(a) forming at least first, second and third metallic oxide semiconductor (MOS) structures, each having a source region and a drain region located within a substrate, a channel located between the source and the drain regions, and a gate terminal structure located above the channel, the source and drain regions serving as bit lines and the gate terminal structure serving as a word line;

(b) forming a dielectric layer and a cap layer in sequence above the first, second and third MOS structures, thereby forming first, second and third memory cell units from the first, second and third MOS structures, respectively;

(c) performing a first coding process, including:
forming a photoresist layer above the gate terminal structures of the first and third memory cell units and covering at least a portion of the cap layer; and
removing portions of the cap layer having no photoresist coverage, to form a cap above the first memory cell unit and a cap above the third memory cell unit; and (d) performing a second coding process, including selectively implanting ions into the channel regions of the first and second memory cell units, whereby threshold voltages of the first and second memory cell units, respectively, are adjusted.

7. The method according to claim 6, wherein the substrate comprises a silicon substrate.

8. The method according to claim 6, wherein the performing a second coding process further includes:
covering the first, second and third memory cell units with a further photoresist layer; and
removing the further photoresist layer above the channels of the first and second memory cell units; and wherein
the selectively implanting ions includes adjusting an impurity concentration in the channels of the first and second memory cell units by ion implantation.

9. The method according to claim 8, wherein the removing the further photoresist layer includes using light exposure and development techniques.

10. The method according to claim 6, wherein the removing portions of the cap layer includes removing the portions by etching the cap layer.

* * * * *